United States Patent [19]

Imai et al.

[11] Patent Number: 4,587,562

[45] Date of Patent: May 6, 1986

[54] SOLID STATE IMAGE PICK-UP DEVICE

[75] Inventors: Masaharu Imai, Kamiina; Jun-ichi Nishizawa, No. 6-16, 1-Chome, Komegafukuro, Sendai, Miyagi Pref. Sohbe Suzuki, Sendai; Takashige Tamamushi, Sendai, all of Japan

[73] Assignees: Olympus Optical Co., Ltd.; Jun-Ichi Nishizawa, Sendai, both of Japan

[21] Appl. No.: 555,986

[22] Filed: Nov. 29, 1983

[30] Foreign Application Priority Data

Dec. 14, 1982 [JP] Japan .................................. 57-217760

[51] Int. Cl.[4] .............................................. H04N 3/14
[52] U.S. Cl. ...................................... 358/212; 357/24
[58] Field of Search ................ 358/212, 213, 209, 41; 250/578; 357/24 LR, 30

[56] References Cited

U.S. PATENT DOCUMENTS

| | | | |
|---|---|---|---|
| 3,721,839 | 3/1973 | Shannon | 358/213 |
| 4,377,817 | 3/1983 | Nishizawa et al. | 357/22 |
| 4,524,391 | 6/1985 | Nishizawa et al. | 358/212 |
| 4,525,742 | 6/1985 | Nishizawa et al. | 358/212 |

OTHER PUBLICATIONS

Nishizawa et al, "Static Induction Transistor Image Sensors," *IEEE Transactions on Electronic Devices*, vol. ED-26, No. 12, Dec. 1979 at 1970.

Nishizawa et al, "High Speed and High Density Static Induction Transistor Memory", *IEEE Journal of Solid-State Circuits*, vol. SC-13, No. 5, Oct. 1978 at 622.

Nishizawa et al, "Field-Effect Transistor Versus Analog Transistor (Static Induction Transistor)," *IEEE Transactions on Electron Devices*, vol. ED-22, Apr. 1975 at 185.

*Primary Examiner*—Gene Z. Rubinson
*Assistant Examiner*—Stephen Brinich
*Attorney, Agent, or Firm*—Parkhurst & Oliff

[57] ABSTRACT

A solid state image pick-up device comprising a large number of picture cells arranged in a matrix. The picture cell comprises a first photoelectric conversion and readout SIT which comprises a gate region operating as a photoelectric conversion area and a second reset SIT which comprises a region (drain or source) electrically connected to the gate region of the first SIT, whereby the photoelectric charges stored in the gate regions of the first SITs of the picture cells in a matrix can be individually reset by means of the related second SITs.

8 Claims, 9 Drawing Figures

FIG_3
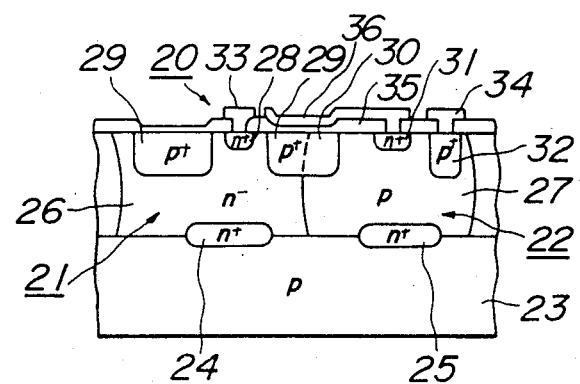

FIG_5

SOLID STATE IMAGE PICK-UP DEVICE

BACKGROUND OF THE INVENTION

The invention relates to a solid state image pick-up device.

In the past, the solid state image pick-up devices have been widely used which comprise charge transfer devices such as CCD, etc. or MOS transistors. However, these image pick-up devices have some drawbacks such as a leakage of charge during a charge transferring operation, a low optical detection sensitivity and packing density, etc. Then, in order to solve all these drawbacks a solid state image pick-up device has been proposed which comprises static induction transistors (SITs). For example, Japanese Patent Laid-Open No. 55-15,229 discloses an image pick-up device of this type which comprises a large number of SITs arranged in a matrix, the gates of the SITs in each row being connected to a corresponding row line, the drains of the SITs in each column being connected to a corresponding column line and the sources of SITs in each row are connected to a corresponding clear line. Further, an improved device of this type has been proposed which comprises a capacitor connected to the gate of each SIT. FIGS. 1A and 1B are a sectional view and a top plan view of the SITs in such a known solid state image pick-up device, respectively.

In this know solid state image pick-up device, an n+-type buried layer 2 forming the source region of the SIT is formed between a p-type substrate and an n-type epitaxial layer 3 deposited thereon, in a surface of which epitaxial layer an n+ drain region 4 and a p+ gate region 5 are formed by means of a thermal diffusion process. In order to effectively control the channel region between the source and drain regions 2 and 4 by means of the gate region 5, the diffusion depth of the drain region 4 is smaller than that of the gate region 5. On the drain region 4 is provided a drain electrode 6 and on the gate region 5 is provided a gate electrode 8 via an insulating layer 7 to form a so-called MIS gate structure which constitutes a gate capacitor. The adjacent SITs are isolated from each other by an insulating region 9 formed between them.

In such a device, it the gate region 5 is reverse biased with respect to the source region 2, in absence of optical input the channel region is depleted so that no drain current flows even when a forward bias is applied between the source and the drain. In this condition, if hole-electron pairs are then generated in the channel region by the optical input, the electrons thus generated are stored or drained by the drain region 4, while the holes are stored in the gate region 5 and charge the gate capacitor of the MIS gate structure to raise the gate potential by $\Delta V_G$. When it is assumed that a sum of the capacitance of the gate capacitor and the capacitance of the depletion layer in the channel region is $C_G$ and the amount of charges generated by the optical input and stored in the gate region is $Q_L$, it holds that $\Delta V_G = Q_L/C_G$. If a readout pulse $\phi_G$ is applied to the gate electrode 8 after a certain storage time, the gate potential becomes $\phi_G + \Delta V_G$ and thus the reverse bias potential between the gate and drain regions 5 and 4 is decreased, so that the depletion layer is reduced to flow a drain current corresponding to the optical input between the source and the drain. This drain current corresponds to $\Delta V_G$ amplified by the amplification factor of the SIT and thus has a large amplitude. It is noted that if the source and the drain of the SIT shown in FIG. 1 are exchanged with each other a similar operation may be obtained.

FIG. 2A shows a circuit arrangement of the solid state image pick-up device comprising the above described SITs arranged in a matrix and each forming a picture cell and FIG. 2B shows signal waveforms for illustrating the operation thereof. In this circuit arrangement, each SIT 10-1, 10-2, ... is a normal-off type p-channel SIT described above and the output video signal corresponding to the optical input may be derived by means of X-Y address system. For this purpose, the sources of the SITs in each row are connected to a common source line 11-1, 11-2, ..., to which lines are selectively applied a bias voltage $V_s$ and the gates of the SITs in each X-row are connected through a corresponding row line 12-1, 12-2, ... to a vertical selection shift register 13. Further, the drains of the SITs in each Y-column are connected to a corresponding column line 14-1, 14-2, ..., these column lines being connected to a video line 17 through corresponding horizontal selection transistors 16-1, 16-2, ..., respectively which transistors are selectively driven by a horizontal selection shift register 15. To the video line 17 is applied a video voltage $V_o$ through a load resistor 18.

Now, the readout operation of one (for example SIT 10-1) of the SITs is considered. At first, it is assumed that the bias voltage $V_s$ which is applied to the source lines 11-1, 11-2, ... is established at a suitable value, for example, zero volt and a row selection pulse $\phi_{G1}$ is applied from the vertical selection shift register 13 to the low line 12-1. In this condition, when a readout pulse $\phi_{D1}$ is then supplied from the horizontal selection shift register 15 to the horizontal selection transistor 16-1, the SIT 10-1 is selected and this SIT flows a drain current through the load resistor 18, the video line 17, the horizontal selection transistor 16-1 and the column line 14-1 to produce an output voltage $V_{out}$ at an output terminal 19. As described above, this drain current is a function of the gate voltage which is a function of the optical input, so that the increment $\Delta V_{out}$ of the output voltage from the dark voltage corresponds to the optical input. That is, this voltage $\Delta V_{out}$ corresponds to $\Delta V_G$ amplified by the amplification factor of SIT and thus has a large amplitude. Subsequently, a readout pulse $\phi_{D2}$ is applied from the horizontal shift register 15 to the horizontal selection transistor 16-2 to read out the SIT-2 and so on. After the readout of all the SITs in this row has been completed, a next row selection pulse $\phi_{G2}$ is applied from the vertical selection shift register 13 to the next row line 12-2, during the duration of which pulse the outputs of the SITs in this row may be successively read out in the manner as described above.

In the solid state image pick-up device described above, the gate potentials of the SITs may be reset in two different ways—that is, a negative going pulse is applied as the bias voltage $V_s$ to each source line 11-1, 11-2, ... to forward bias the p-n junction between the gates and sources of the SITs in each row, or the row selection pulse applied to the gates of the SIT in each row is selected in suitably large amplitude and long duration so that each SIT in the row may be reset simultaneously with the readout thereof. However, the first reset method has a drawback that the signal charge integration periods of the respective SITs in a row are different from each other, because the SITs are reset in each row. The second reset method is unstable in operation which is undesirable in practical use and also has the same drawback of the first method.

SUMMARY OF THE INVENTION

An object of the invention is to eliminate the described drawbacks and to provide a solid state image pick-up device in which the picture cells can be individually reset so that the signal charge integration periods of all the picture cells are equal to each other.

A solid state image pick-up device according to the invention is characterized in that picture cells thereof each comprise a first transistor which comprises a gate region operating as a photoelectric conversion region and serves to read out a picture cell information corresponding to photoelectric charges stored in said gate region and a second transistor which comprises a semiconductor region electrically connected to said gate region of the first transistor and serves to reset the photoelectric charges stored in said gate region to a predetermined reset state.

BRIEF DESCRIPTION OF THE DRAWING

The invention will now be described in detail with reference to the accompanying drawings in which:

FIG. 3 is a sectional view of an embodiment of a picture cell in the solid state image pick-up device according to the invention;

DESCRIPTION OF THE PREFERRED EMBODIMENT

Figure 1A:
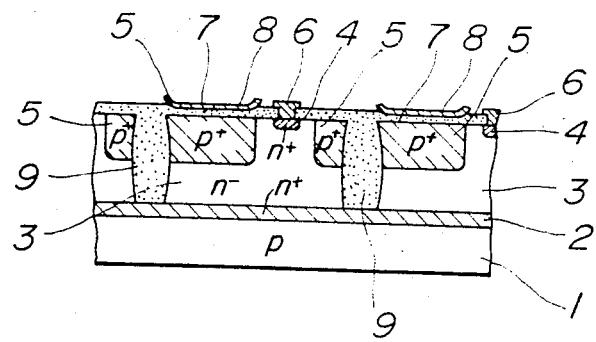
FIGS. 1A and 1B are a sectional view and a plan view of the known SITs each forming a picture cell.
Figure 1B:
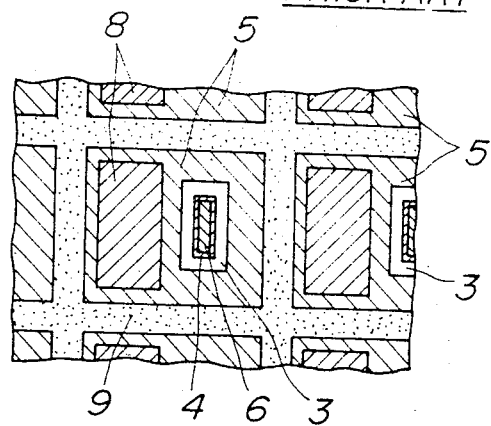

FIG. 3 shows an embodiment of a picture cell in the solid state image pick-up device according to the invention. In this embodiment, a picture cell 20 comprises a first photoelectric conversion and readout transistor 21 and a second reset transistor 22. The first and second transistors are formed on one and the same substrate as the SIT structure. That is, two spaced n+ buried regions 24 and 25 which form a source region of the photoelectric conversion and readout SIT 21 and a first gate region of the reset SIT 22, respectively are formed on a p-type substrate 23. On the substrate 23 and the buried regions 24 and 25 are formed an n− epitaxial layer 26 which forms the channel region of the SIT 21 and a p− or p well which forms the channel region of the SIT 22. An n+ drain region 28 of the SIT 21 is formed in the surface of the n-epitaxial layer and a p+ diffused region 29, 30 is formed in the surfaces of the n− epitaxial layer 26 and the p well 27 in such manner that the p+ diffused region 29, 30 surrounds the drain region 28 and partially extends into the p well 27, whereby a portion 29 of the p+ region within the n− epitaxial layer 26 forms the gate region of the SIT 21 and the other portion 30 of the p+ region within the p well 27 forms the source region of the SIT 22. Further, in the surface of the p well are formed an n+ region 31 forming a second gate and a p+ drain region 32 of the SIT 22. On the drain regions 28 and 32 of the SITs 21 and 22 are provided drain electrodes 33 and 34 in contact thereto, respectively. The drain electrode 34 of the SIT 22 may be formed by a light shield metal layer of for example Al which shields the incident light on full surface area rather than the photoelectric conversion area of SIT 21. On the gate region 29 of the SIT 21 is provided a gate electrode 36 via an insulating layer 35 and this gate electrode 36 extends to the second gate region 31 and contacted thereto. That is, the SIT 21 has the gate in the form of a MIS structure which constitutes a gate capacitor and the SIT 22 has the first and second gate regions 25 and 31 by which ON and OFF of the SIT 22 is controlled. The remaining surface area of the n− epitaxial layer 26 and the p well 27 is covered with the insulating layer 35. In the embodiment described above the gate region of the SIT 21 and the source region of the SIT 22 are formed by a single common region, but these regions may be formed by two separate regions which are electrically connected to each other by a conductor.

In the solid state image pick-up device according to the invention, a large number of picture cells as shown in FIG. 3 are formed on one and the same substrate and arranged for example in a matrix. In this case, an insulating region may be formed between the adjacent cells to isolate them from each other or a diffused isolation region may be formed between the adjacent cells, to which region is applied a suitable bias voltage to generate a depletion layer which isolate the cells from each other.

Figure 2A:
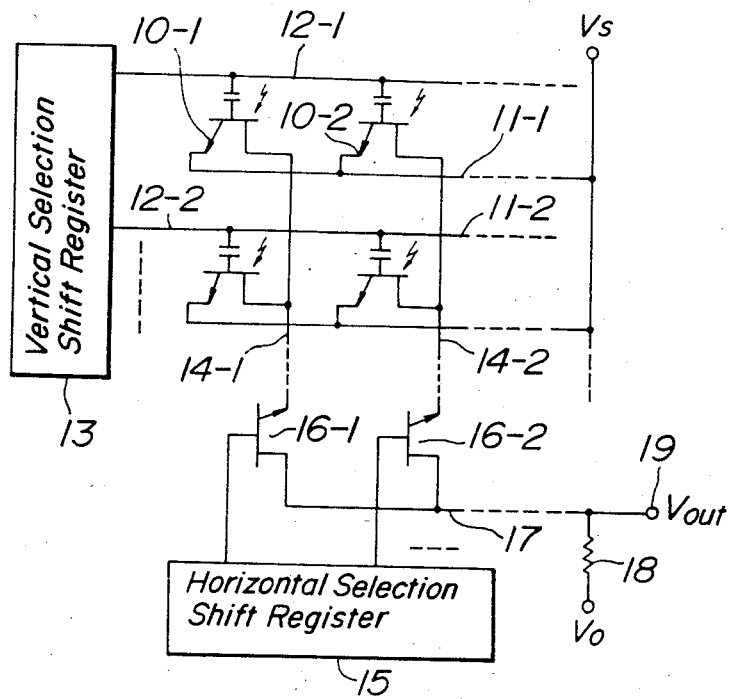
FIG. 2A is a circuit diagram of the known solid state image pick-up device comprising the known SITs and FIG. 2B shows waveforms for illustrating the operation thereof.
Figure 2B:
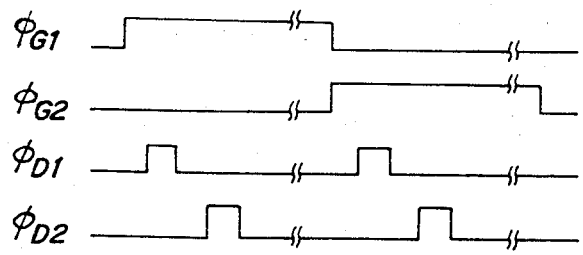
Figure 4:
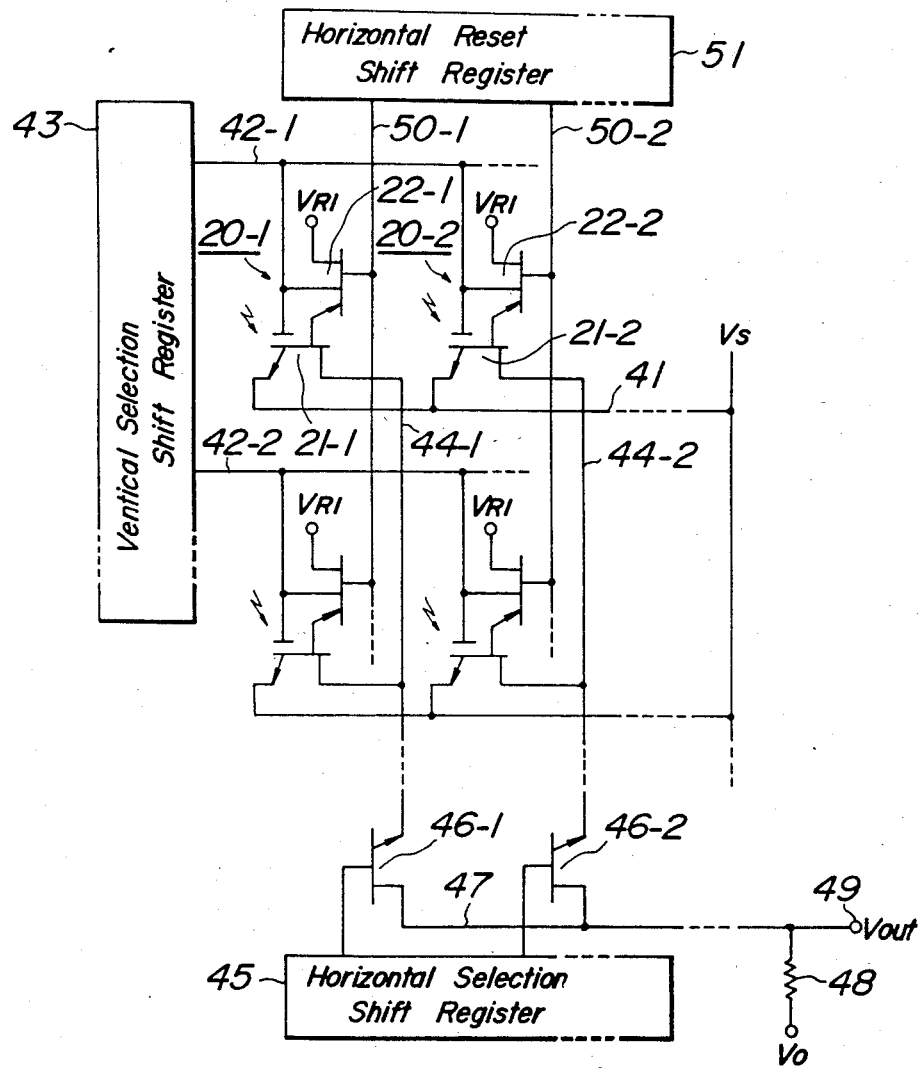
FIG. 4 shows a circuit diagram of an embodiment of the solid state image pick-up device according to the invention and FIG. 5 shows waveforms for illustrating the operation thereof.

FIG. 4 shows a circuit diagram of an embodiment of the solid state image pick-up device according to the invention. The image pick-up device comprises the picture cells as shown in FIG. 3 which are formed on one and the same substrate and arranged in a matrix. The sources of the photoelectric conversion and read-out SITs 21-1, 21-2, ... of all the picture cells 20-1, 20-2, ... are connected to a source line 41 for supplying a source bias voltage $V_s$. The gates of the SITs 21-1, 21-2, ... and the second gates of the SITs 22-1, 22-2, ... of the cells in each X-row are connected through a corresponding vertical selection line 42-1, 42-2, ... to a vertical selection shift register 43. The drains of the SITs 21 of the cells in each Y-column are connected to a corresponding horizontal selection line 44-1, 44-2, ..., these selection lines being connected to a video line 47 through corresponding horizontal selection switches 46-1, 46-2, ... respectively which are driven by a horizontal selection shift register 45. To the video line 47 is applied a video voltage $V_o$ higher than the source voltage $V_s$ through a load resistor 48. The picture cell information may be sequentially obtained from an output 49 by controlling the vertical and horizontal selection shift registers 43 and 45 in the same manner as described in FIG. 2.

Further, the first gates of the SITs 22 of the cells in a Y-column are connected through a corresponding horizontal reset selection line 50-1, 50-2, ... to a horizontal reset shift register 51, whereby the SITs 22-1, 22-2, ... may be sequentially selected by the horizontal reset shift register 51 and the vertical selection shift register 53. Further, a reset voltage $V_{R1}$ which provides reverse bias with respect to the source voltage $V_s$ is applied to the drains of all the SITs 22 through the drain electrodes 35 which may be formed as a light shield metal layer to shield the incident light on full surface area rather than the photoelectric conversion area of the SITs 21.

Figure 5:
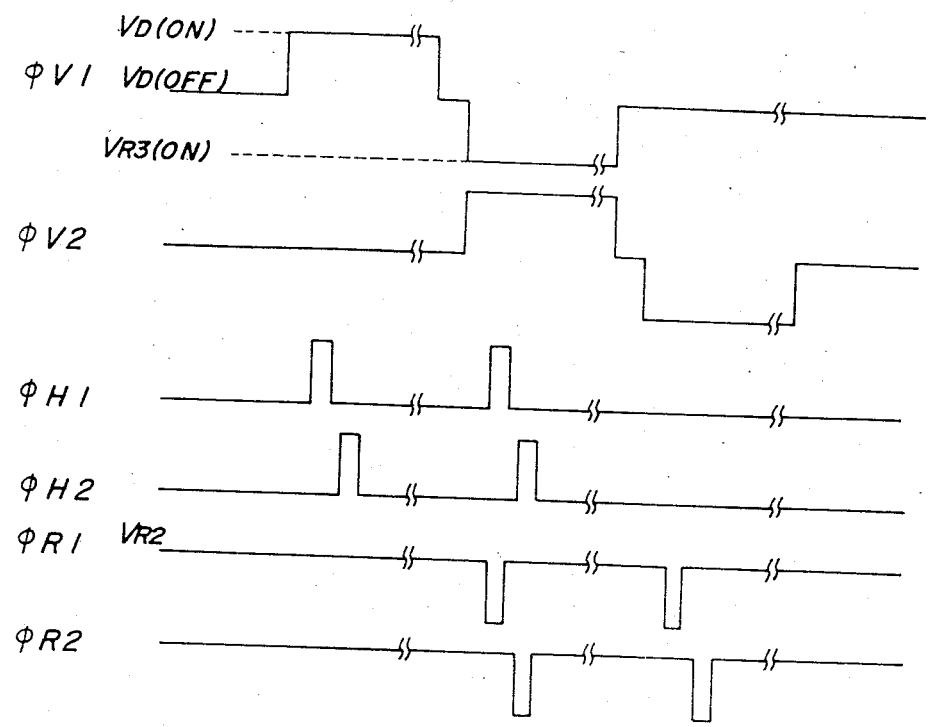

The operation of the device shown in FIG. 4 will now be described with reference to the waveforms as shown in FIG. 5.

In a state in which both the photoelectric conversion and readout SIT 21 and the reset SIT 22 of each picture cell are not selected, the potentials of the two gates of the reset SIT 22, i.e. the potential $V_D$ (OFF) on the vertical selection line 42-1, 42-2, ... and the potential $V_{R2}$ on the horizontal reset line 50-1, 50-2, ... are so established that a portion of the signal charges stored in the photoelectric conversion and readout SIT 21 flows through the channel of the reset SIT 22 to the reset voltage $V_{R1}$. That is, the gate potentials of the reset SIT 22 in an unselected state are established at a lower value than a gate potential which turns on the photoelectric conversion and readout SIT 21. Moreover, the potential $V_D$ (OFF) on the vertical selection line 42-1, 42-2, ... in an unselected state is established at backward bias to the source voltage $V_s$. In this case, the picture cell in which both the photoelectric conversion and readout SIT 21 and the reset SIT 22 are not selected cannot be turned on undesirably even when the stored signal charges and hence $\Delta V_G$ becomes very large due to the strong incident light and $V_D$ (OFF)$+\Delta V_G$ ($\Delta V_G > 0$) becomes higher than the pinch-off voltage with respect to the established source voltage $V_s$. This is because a portion of the stored charges which exceeds the pinch-off voltage is drained through the unselected reset SIT 22 to the reset voltage $V_{R1}$. Thus, the signal interference between adjacent picture cells can be effectively prevented.

Readout of the picture cell information can be effected as follows: At first, a row selection pulse having a read ON level $V_D$ (ON) higher than the read OFF level $V_D$ (OFF) as show by $\phi_{V1}$ in FIG. 5 is supplied from the vertical selection shift register 43 to one (for example 42-1) of the vertical selection lines. Then, during the duration of the row selection pulse a readout pulse as shown by $\phi_{H1}$ is supplied from the horizontal selection shift register 45 to the horizontal selection switch 46-1 to select the SIT 21-1 of the cell 20-1, thereby flowing a drain current of the SIT 21-1 through the load resistor 48, the video line 47, the switch 46-1 and the line 44-1 to produce as its picture cell information an output voltage $V_{out}$ corresponding to the drain current on an output 49. As described hereinbefore, the drain current is a function of the gate voltage which is a function of the optical input, so that the increment $\Delta V_{out}$ of the output voltage from the dark voltage corresponds to the optical input. That is, this voltage $\Delta V_{out}$ corresponds to $\Delta V_G$ amplified by the amplification factor of SIT 21-1 and thus has a large amplitude. After readout of the cell 20-1, the horizontal selection shift register 45 supplies a next readout pulse as shown by $\phi_{H2}$ in FIG. 5 to the next horizontal selection switch 46-2 to read out the SIT 21-2 and so on. After all the cells in the row has been read out, the vertical selection shift register 43 supplies a next row selection pulse as shown by $\phi_{V2}$ in FIG. 5 to the next vertical selection line 42-2, during the duration of which pulse the cells in this row are successively read out by successive readout pulses from the horizontal selection shift register 45.

Reset of the picture cells can be effected as follows. After readout of all the cells in one row, for example first row has been completed, the vertical selection shift register 43 supplies to the first vertical selection line 42-1 a row selection pulse having an opposite polarity to the first mentioned row selection pulse and having a reset level $V_{R3}$ (ON) lower than the read OFF level $V_D$ (OFF) as shown by $\phi_{V1}$ in FIG. 5. The pinch-off voltage of the reset SIT 22 of each cell has been established such that it cannot be switched on by only pulse $V_{R3}$ (ON). During the duration of this pulse $V_{R3}$ (ON), the horizontal reset shift register 51 supplies a reset pulse as shown by $\phi_{R1}$ in FIG. 5 having a negative polarity relative to $V_{R2}$ to the horizontal reset selection line 50-1 to select the reset SIT 22-1 of the cell 20-1. In this case, the gate potential of SIT 22-1 exceeds the pinch-off voltage to turn on the SIT 22-1, as a result of which the charges stored in the gate region 29 of the SIT 21-1 are drained through the drain region 32 of the SIT 22-1 and thus the potential of the gate region 29 is returned to the initial voltage which provides reverse bias relative to the source voltage $V_s$, so that the SIT 21-1 is reset. After reset of the SIT 21-1, the horizontal reset shift register 51 supplies a next reset pulse as shown by $\phi_{R2}$ in FIG. 5 to the next horizontal reset selection line 50-2 to select and turn on the SIT 22-2 thereby resetting the SIT 22-1. After the SITs 21 of all the cells in the first row have been reset, the vertical selection shift register 43 supplies a row selection pulse $V_{R3}$ (ON) (see $\phi_{V2}$ in FIG. 5) to the next vertical selection line 42-2, during the duration of which pulse the photoelectric conversion and readout SITs 21 in the second row are successively reset by successive reset pulses from the reset shift register 51.

The reset period of each row may be situated not only immediately after the readout period of each row but also at any instant, thereby obtaining an electronic shutter effect.

Figure 6:
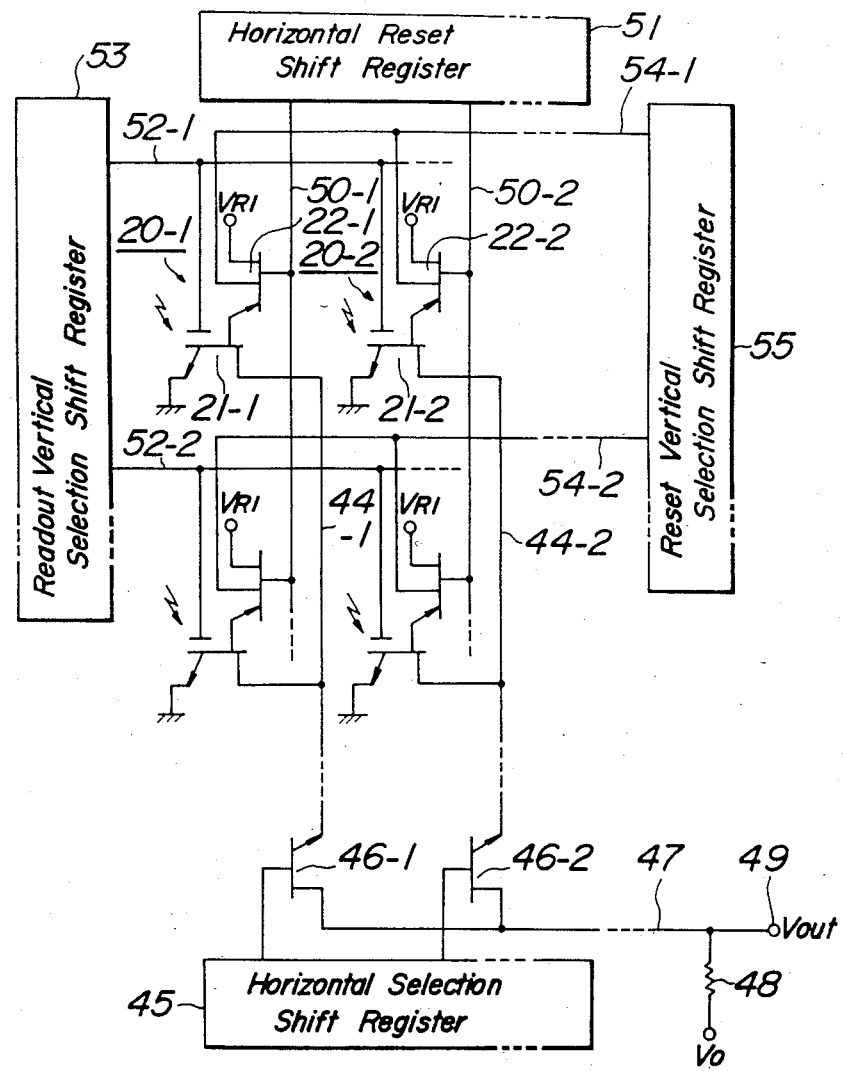
FIG. 6 shows a circuit diagram of another embodiment the solid state image pick-up device according to the invention.

FIG. 6 shows a circuit diagram of another embodiment of the solid state image pick-up device according to the invention. In this embodiment, the gate electrode of the photoelectric conversion and readout SIT 21 and the second gate electrode of the reset SIT 22 in each picture cell are disconnected from each other. The gate electrodes of the photoelectric conversion and readout SITs 21 of the cells in each row are connected through a corresponding readout vertical selection line 52-1, 52-2, ... to a readout vertical selection shift register 53 which selectively supplies a readout selection pulse having a $V_D$ (ON) level to the lines 52-1, 52-2, .... The second gate electrodes of the reset SITs 22 in each row are connected through a corresponding reset vertical selection line 54-1, 54-2, ... to a reset vertical selection shift register 55 which selectively supplies a reset selection pulse having $V_{R3}$ (ON) level to the lines 54-1, 54-2, .... That is, in the previous embodiment show in FIG. 4 the common vertical selection shift register 43, and vertical selection line 42-1, 42-2, ... are utilized to supply the selection pulses having different levels during the readout and reset periods, respectively, to each row, while in the present embodiment the readout and reset vertical selection lines are utilized, to which lines the readout and reset selection pulses are supplied by the respective shift registers. In this case, the respective shift registers are requested to generate the pulse signal having only two levels, so that the circuit arrangement can be more simple compared to the previous embodiment in which the pulse signal having three levels must be generated.

In the present embodiment, in order to select the reset vertical selection line 54-1, 54-2, ... use is made of the reset vertical selection shift register 55, but the readout vertical selection shift register 53 may be co-used as the reset vertical shift register to supply the readout and reset selection pulses to the readout and reset vertical selection lines 52-1, 52-2, ... and 54-1, 54-2, ..., respectively via a changeover switch.

Figure 7:
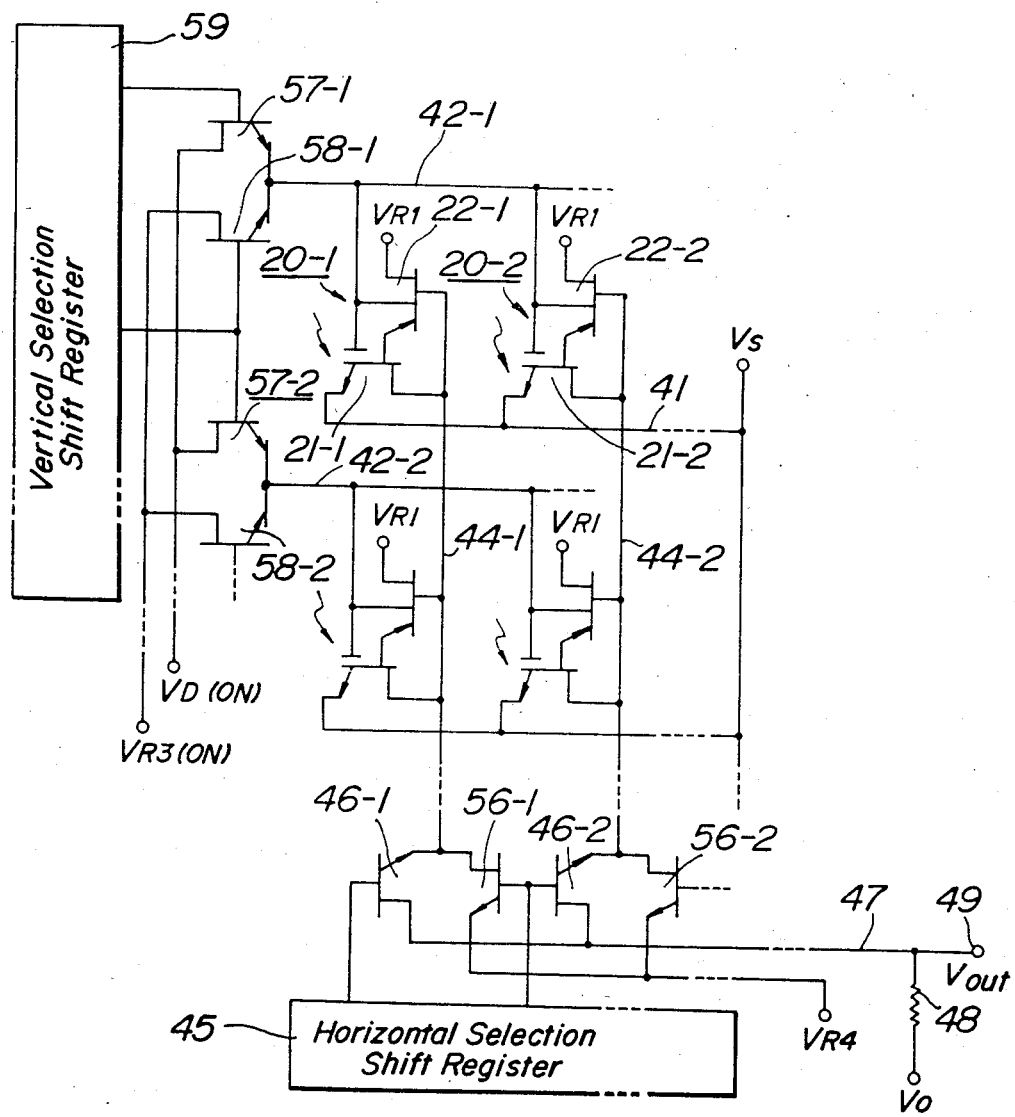
FIG. 7 shows a circuit diagram of still another embodiment of the device according to the invention.

FIG. 7 shows a circuit diagram of still another embodiment of the solid state image pick-up device according to the invention. In this embodiment, each of the readout horizontal selection lines 44-1, 44-2, ... is also connected to the first gates of the reset SITs 22 of the cells in each column and may be also used as the reset horizontal selection line 50-1, 50-2, ... as shown in FIG. 4 for supplying the reset voltage. To this end, in addition to the horizontal selection switches 46-1, 46-2, ..., horizontal reset switches 56-1, 56-2 ... are connected to the horizontal selection lines 44-1, 44-2, ..., respectively. That is, to the respective horizontal selection lines is connected paired switches, horizontal selection switch and horizontal reset switch. The horizontal reset switch of each paired switches and the horizontal selection switch of the successively following paired switches are commonly driven by the respective outputs of the horizontal selection shift register 45, so that when the horizontal selection switch of each paired switches is turned on to supply the video voltage $V_o$ to the related horizontal selection line, the horizontal reset switch of the preceding paired switches is turned on to supply a reset voltage $V_{R4}$ to the preceding horizontal selection line. If the turn-on voltage of the horizontal selection switches 46-1, 46-2, ... and that of the horizontal reset switches 56-1, 56-2, ... are different from each other, the required different switching pulses for the horizontal selection switches and the reset switches may be generated in response to the output of the horizontal selection shift register 45 in a know manner.

In this embodiment, further, the respective vertical selection lines 42-1, 42-2, ... may be used, after reading out the related row, as the reset vertical selection line for supplying the reset vertical selection pulse $V_{R3}$ (ON). To this end, to the respective vertical selection lines 42-1, 42-2, ... is connected to paired switches of readout and reset vertical selection switches 57-1 and 58-1; 57-2 and 58-2; .... The readout switch 47 of each paired switches and the reset switch 58 of the successively following paired switches are commonly turned on by the respective output pulses of the vertical shift register 59, so that when the readout selection voltage $V_D$ (ON) is supplied to the related vertical line, the reset selection voltage $V_{R3}$ (ON) is applied to the preceding vertical selection line. The selection lines 42-1, 42-2, ... may be divided into two vertical selection lines for readout and reset as in FIG. 6 and these readout and reset vertical selection lines may be selected by respective shift registers.

The present invention is not limited to the embodiments described above, but many modifications may be conceived by those skilled in the art within the scope of the invention. For example, the photoelectric conversion and readout transistor and the reset transistor may consist of field effect transistor (FET) or one of the two transistors may consist of SIT and the other may consist of FET. Further, the reset transistor may be not only of junction type but also of MOS type and may comprises a single gate region. Further, the gate and drain of this reset transistor may be used as the picture cell selection terminal. Further, the photoelectric and readout transistor may be of the p-channel type and the reset transistor may be of the n-channel type.

As described above, according to the invention the picture cell comprises a first photoelectric conversion and readout transistor which comprises a gate region operating as a photoelectric conversion region and serves to read out the picture cell information corresponding to photoelectric charges stored in the gate region and a second reset transistor for resetting the photoelectric charges which comprises a region electrically connected to the gate region of the first transistor and serves to selectively reset the photoelectric charges stored in the gate region to a predetermined state, so that the picture cells in a matrix can be individually reset and thus the signal charge integration periods of all the cells can be equal to each other. Further, according to the picture cell constructed as shown in FIG. 3, the potentials of the two gates of the reset SITs in unselected state may be so established that undesired turn-on of the photoelectric conversion and readout transistor can be prevented, thereby preventing the signal interference between the adjacent cells. Further, the matrix cells can be individually reset and thus the reset timing can be optionally set, thereby obtaining an electronic shutter effect.

What is claimed is:

1. A solid state image pick-up device comprising: a plurality of picture cells, each of said picture cells comprising a first transistor and a second transistor, said first transistor comprising a gate region operating as a photoelectric conversion region and serving to read out picture cell information corresponding to photoelectric charges stored in said gate region, and said second transistor comprising a semiconductor region electrically connected to said gate region of said first transistor and serving to reset said photoelectric charges stored in said gate region to a predetermined reset state;

further comprising one semiconductor substrate, wherein said first and second transistors being formed as complementary SITs (Static Induction Transistors) on said semiconductor substrate;

wherein said first SIT comprises a buried source region of a first conductivity type provided on said substrate, a drain region of a first conductivity type provided in a surface on an epitaxial layer portion of a first conductivity type which is provided on said substrate and which forms a channel region of said first SIT, and a gate region of a second conductivity type which surrounds said drain region and has a greater depth than a depth of said drain region; and wherein the second SIT comprises source and drain regions of a second conductivity type provided in a surface of a well of a second conductivity type which is provided on said substrate adjacent to said epitaxial layer portion and which forms a channel region of said second SIT, first buried and second surface gate regions of said first conductivity type provided on said substrate and said surface of said well between said source and drain regions, respectively, said source region of said second SIT being connected to said gate region of said first SIT.

2. A solid state image pick-up device as claimed in claim 1, wherein said gate region of said first SIT and said source region of said second SIT being formed by a single surface region of a second conductivity type which surrounds said drain region of said first SIT and partially extends into said well.

3. A solid state image pick-up device as claimed in claim 2, wherein a large number of said picture cells each comprise a first photoelectric conversion and readout SIT and a second reset SIT being formed on one semiconductor substrate and arranged in a matrix, adjacent picture cells being isolated from each other by an isolation region provided therebetween.

4. A solid state image pick-up device as claimed in claim 3, wherein said device further comprises vertical selection shift register means having a plurality of outputs, vertical selection line means connected to said outputs of said vertical selection register means, vertical connection means for connecting the gates of said first SITs and the second gates of the second SITs of the cells in each row to related vertical selection line means, horizontal selection shift register means having a plurality of outputs, horizontal selection line means connected to said outputs of said horizontal selection shift register means, and horizontal connection means for connecting said drains of said first SITs and the first gates of the second SITs of the cells in each column to related horizontal selection line means, whereby the first SITs of said cells in a row are successively turned on to readout the picture cell informations stored therein and the second SITs of the cells in the read row are successively turned on to reset the first SITs thereof.

5. A solid state image pick-up device as claimed in claim 4, wherein said vertical selection shift register means comprises a vertical selection shift register, said vertical connection means comprises means for commonly connecting said gate of said first SIT and said second gate of said second SIT of each cell to related vertical selection line means, said horizontal selection shift register means comprises a horizontal selection shift register, a horizontal reset shift register and horizontal selection switches controlled by the horizontal selection shift register, said horizontal selection line means comprises a set of readout lines connected to respective horizontal selection switches and a set of reset lines, said horizontal connection means comprises means for connecting the drain of the first SIT of each cell to a related readout line and means for connecting the first gate of the second SIT of each cell to a related reset line, whereby the vertical selection shift register supplies successively a readout row selection pulse to the respective vertical selection line means, during the duration of which pulse the horizontal selection shift register successively turns on the horizontal selection switches to readout successively the picture cell informations stored in the first SITs of the cells in that row and then the vertical selection shift register supplies successively a reset row selection pulse to the respective vertical selection line means, during the duration of which pulse the horizontal reset shift register supplies successively a reset pulse to the reset lines to successively turn on the second SITs of the cells in each read row to reset the first SITs thereof.

6. A solid state image pick-up device as claimed in claim 4, wherein said vertical selection shift register means comprises a readout vertical selection shift register and a reset vertical selection shift register, said vertical selection line comprises a set of readout vertical selection lines and a set of reset vertical selection lines, said vertical connection means comprises means for connecting said gate of said first SIT of each cell to a related readout vertical selection line and means for connecting said second gate of said second SIT of each cell to a related reset vertical selection line, said horizontal selection shift register means comprises a horizontal selection shift register, a horizontal reset shift register and horizontal selection switches controlled by said horizontal selection shift register, said horizontal selection line means comprises a set of readout lines connected to respective horizontal selection switches and a set of reset lines, said horizontal connection means comprises means for connecting said drain of said first SIT of each cell to he related readout line and means for connecting said first gate of said second SIT of each cell to the related reset line, whereby the readout vertical selection shift register supplies successively a readout row selection pulse to the respective readout vertical selection line, during the duration of which pulse the horizontal selection shift register successively turns on the horizontal selection switches to readout successively the picture cell informations stored in the first SITs of the cells in that row and then the reset vertical selection shift register supplies successively a reset row selection pulse to the respective reset vertical selection line, during the duration of which pulse the horizontal reset shift register supplies successively a reset pulse to the reset lines to successively turn on the second SITs of the cells in each read row to reset the first SITs thereof.

7. A solid state image pick-up device as claimed in claim 4, wherein said vertical selection shift register means comprises a vertical selection shift register having a plurality of outputs and a plurality of switch pairs each of which includes a vertical readout switch and a vertical reset switch commonly connected to the related vertical selection line means, said vertical reset switch of each switch pair and the vertical readout switch of the successively following paired switches being commonly driven by the respective outputs of said vertical selection shift register, whereby when the vertical readout switch of each switch pair is turned on to supply a readout row selection pulse for enabling the first SITs of the cells in each row to be turned on, the vertical reset switch of the preceding switch pair is turned on to supply a reset row selection pulse for enabling the second SITs of the cells in each preceding row to be turned on.

8. A solid state image pick-up device as claimed in claim 7, wherein said horizontal selection shift register means comprises a horizontal selection shift register having a plurality of outputs and a plurality of switch pairs each of which includes a horizontal readout switch and a horizontal reset switch commonly connected to the related horizontal selection line means, the horizontal reset switch of each switch pair and the horizontal readout switch of the successively following paired switches being commonly driven by the respective outputs of the horizontal selection shift register, whereby when the horizontal readout switch of each switch is turned on to read out the enabled first SIT of cells in the related column, the horizontal reset switch of the preceding switch is turned on to supply a reset pulse to the enabled second SIT of the cells in the preceding column.

* * * * *